(12) United States Patent
Manohararajah et al.

(10) Patent No.: US 7,620,925 B1
(45) Date of Patent: Nov. 17, 2009

(54) METHOD AND APPARATUS FOR PERFORMING POST-PLACEMENT ROUTABILITY OPTIMIZATION

(75) Inventors: Valavan Manohararajah, Scarbough (CA); Gordon Raymond Chiu, Richmond Hill (CA); Deshanand Singh, Mississauga (CA); Stephen D. Brown, Toronto (CA)

(73) Assignee: Altera Corporation, San Jose, CA (US)

( * ) Notice: Subject to any disclaimer, the term of this patent is extended or adjusted under 35 U.S.C. 154(b) by 101 days.

(21) Appl. No.: 11/520,124

(22) Filed: Sep. 13, 2006

(51) Int. Cl.
*G06F 17/50* (2006.01)
(52) U.S. Cl. .......................... 716/16; 716/18
(58) Field of Classification Search ................. 716/16, 716/18
See application file for complete search history.

(56) References Cited

U.S. PATENT DOCUMENTS

| | | | |
|---|---|---|---|
| 5,612,893 A * | 3/1997 | Hao et al. ................. | 716/2 |
| 5,619,419 A * | 4/1997 | D'Haeseleer et al. ...... | 716/8 |
| 6,446,245 B1 * | 9/2002 | Xing et al. ............... | 716/10 |
| 7,191,426 B1 * | 3/2007 | Singh et al. .............. | 716/16 |
| 7,219,048 B1 * | 5/2007 | Xu ......................... | 703/19 |
| 7,290,232 B1 * | 10/2007 | Fung et al. .............. | 716/6 |
| 7,290,240 B1 * | 10/2007 | Lam-Leventis et al. ... | 716/18 |
| 7,308,664 B1 * | 12/2007 | Fung et al. ............... | 716/6 |
| 7,318,210 B1 * | 1/2008 | Singh et al. .............. | 716/9 |
| 7,337,100 B1 * | 2/2008 | Hutton et al. ............ | 703/13 |
| 2002/0166104 A1 * | 11/2002 | Wu et al. .................. | 716/12 |
| 2003/0041309 A1 * | 2/2003 | Chopra et al. ............ | 716/12 |
| 2004/0088663 A1 * | 5/2004 | Wu et al. .................. | 716/6 |
| 2004/0139410 A1 * | 7/2004 | Ghameshlu et al. ...... | 716/6 |
| 2004/0243964 A1 * | 12/2004 | McElvain et al. ........ | 716/12 |
| 2005/0097485 A1 * | 5/2005 | Guenthner et al. ....... | 716/6 |
| 2006/0026546 A1 * | 2/2006 | Dinter et al. ............. | 716/11 |
| 2006/0031798 A1 * | 2/2006 | Dirks et al. .............. | 716/6 |
| 2006/0253815 A1 * | 11/2006 | Bjesse et al. ............. | 716/5 |
| 2006/0271894 A1 * | 11/2006 | Arunachalam ............ | 716/10 |
| 2006/0288323 A1 * | 12/2006 | Birch ...................... | 716/12 |
| 2007/0050745 A1 * | 3/2007 | Dinter et al. ............. | 716/11 |
| 2007/0204252 A1 * | 8/2007 | Furnish et al. ........... | 716/10 |
| 2007/0271543 A1 * | 11/2007 | Alpert et al. ............. | 716/13 |
| 2008/0005704 A1 * | 1/2008 | Miloslavsky et al. ..... | 716/2 |
| 2008/0028347 A1 * | 1/2008 | Hiraoglu et al. .......... | 716/5 |
| 2008/0201678 A1 * | 8/2008 | Ang et al. ................. | 716/8 |
| 2009/0132990 A1 * | 5/2009 | McElvain et al. ........ | 716/14 |

FOREIGN PATENT DOCUMENTS

JP           04243482 A   *   8/1992

* cited by examiner

*Primary Examiner*—Phallaka Kik
(74) *Attorney, Agent, or Firm*—L. Cho

(57) ABSTRACT

A method for designing a system on a target device includes synthesizing the system. The system is placed on the target device. Optimizing placement of the system for routing is performed after placing the system. The system is routed after optimizing placement.

16 Claims, 9 Drawing Sheets

METHOD AND APPARATUS FOR PERFORMING POST-PLACEMENT ROUTABILITY OPTIMIZATION

TECHNICAL FIELD

Embodiments of the present invention relates to tools such as electronic design automation (EDA) tools for designing systems on field programmable gate arrays (FPGAs). More specifically, embodiments of the present invention relates to a method and apparatus for performing post-placement routability optimization using EDA tools.

BACKGROUND

FPGAs may be used to implement large systems that include million of gates and megabits of embedded memory. Of the tasks required in creating and optimizing a design, placement of components on the FPGAs and routing connection between components on the FPGA utilizing available resources can be the most challenging and time consuming. In order to satisfy placement and routing specifications, several iterations are often required to determine how components are to be placed on the target device and which routing resources to allocate to connect the components. The complexity of large systems often requires the use of EDA tools to create and optimize their design onto physical target devices. Automated placement and routing algorithms in EDA tools perform the time consuming task of placement and routing of components onto physical devices.

In the past, routability optimizations, where the length of wires used to connect components in a system, were typically performed before placement of the system. Attempts to perform routability optimizations during the early stages of system design required a fair amount of estimations as to the position of components on the target device. In instances where the estimations are inaccurate, the routability optimizations would be ineffective.

Thus, what is needed is an efficient method and apparatus for performing post-placement routability optimization.

SUMMARY

According to an embodiment of the present invention, routability optimizations are performed in a computer aided design flow after placement and before routing. According to one aspect of this embodiment, fanout splitting is used as a routability optimization. According to an alternate aspect of this embodiment, logic duplication is used as a routability optimization. According to another aspect of this embodiment, local rewiring is used as a routabilility optimization.

BRIEF DESCRIPTION OF THE DRAWINGS

The features and advantages of the present invention are illustrated by way of example and are by no means intended to limit the scope of the present invention to the particular embodiments shown.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
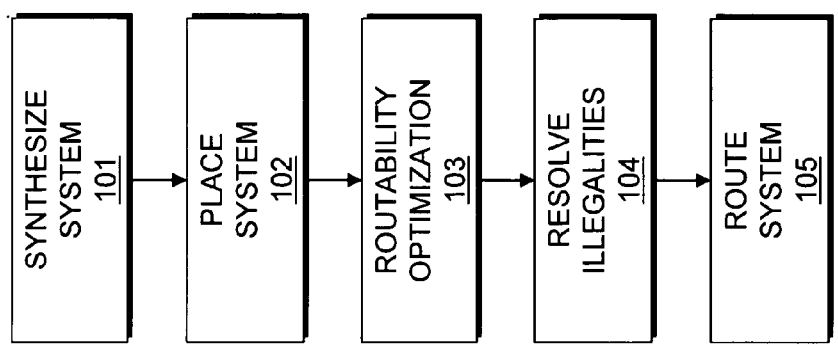
FIG. 1 is a flow chart illustrating a method for designing a system on a logic design according to an embodiment of the present invention.

FIG. 1 is a flow chart illustrating a method for designing a system according to an embodiment of the present invention. The target device may be an ASIC, structured ASIC, FPGA, programmable logic device (PLD), printed circuit board (PCB), or other target device. At 101, the system is synthesized. Synthesis includes generating a logic design of the system to be implemented. According to an embodiment of the present invention, synthesis generates an optimized logical representation of the system from a HDL design definition. The optimized logical representation of the system may include a representation that has a minimized number of functional blocks and registers, such as logic gates and logic elements, required for the system. Synthesis also includes mapping the optimized logic design (technology mapping). Mapping includes determining how to implement logic gates and logic elements in the optimized logic representation with resources (components) available on the target device. According to an embodiment of the present invention, a netlist is generated from mapping. This netlist may be an optimized technology-mapped netlist generated from the HDL.

At 102, the mapped logical system design is placed. Placement works on the optimized technology-mapped netlist to produce a placement for each of the functional blocks. According to an embodiment of the present invention for a target device that is a structured ASIC, placement includes fitting the system on the target device by determining which components on the logic design are to be used for specific logic elements, and other function blocks. Placement may include clustering which involves grouping logic elements together to form the logic clusters present on the target device.

At 103, routability optimization is performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 104, architectural violations or illegalities from routability optimizations are resolved. According to an embodiment of the present invention, the illegalities are resolved using incremental placement. The changes to the netlist generated from the routability optimization is placed on the layout of the existing system placed at 102. Incremental placement involves evaluating resources on a target device such as logic array blocks (LABs) that have architectural violations or illegalities from routability optimization. Incremental placement attempts to perturb the preferred locations as little as possible to ensure that the final placement respects all architectural constraints. Incremental placement attempts to identify non-critical logic elements (LEs) that may be moved from their preferred locations to resolve architectural violations in order that truly critical elements may stay at their preferred locations. Incremental placement may be performed by an incremental placement engine in an EDA tool that utilizes incremental placement algorithms. One incremental placement technique that may be used at 104 is described in patent application Ser. No. 10/617,502 entitled "Method and Apparatus for Performing Incremental Placement for Layout-Driven Optimizations on Field Programmable Gate Arrays", which is herein incorporated by referenced.

At 105, it is determined which routing resources should be used to connect the components in the logic design implementing the functional blocks of the system. During routing, routing resources on the target device are allocated to provide interconnections between logic gates, logic elements, and other components on the target device. The routing procedure may be performed by a router in an EDA tool that utilizes routing algorithms.

Figure 2:
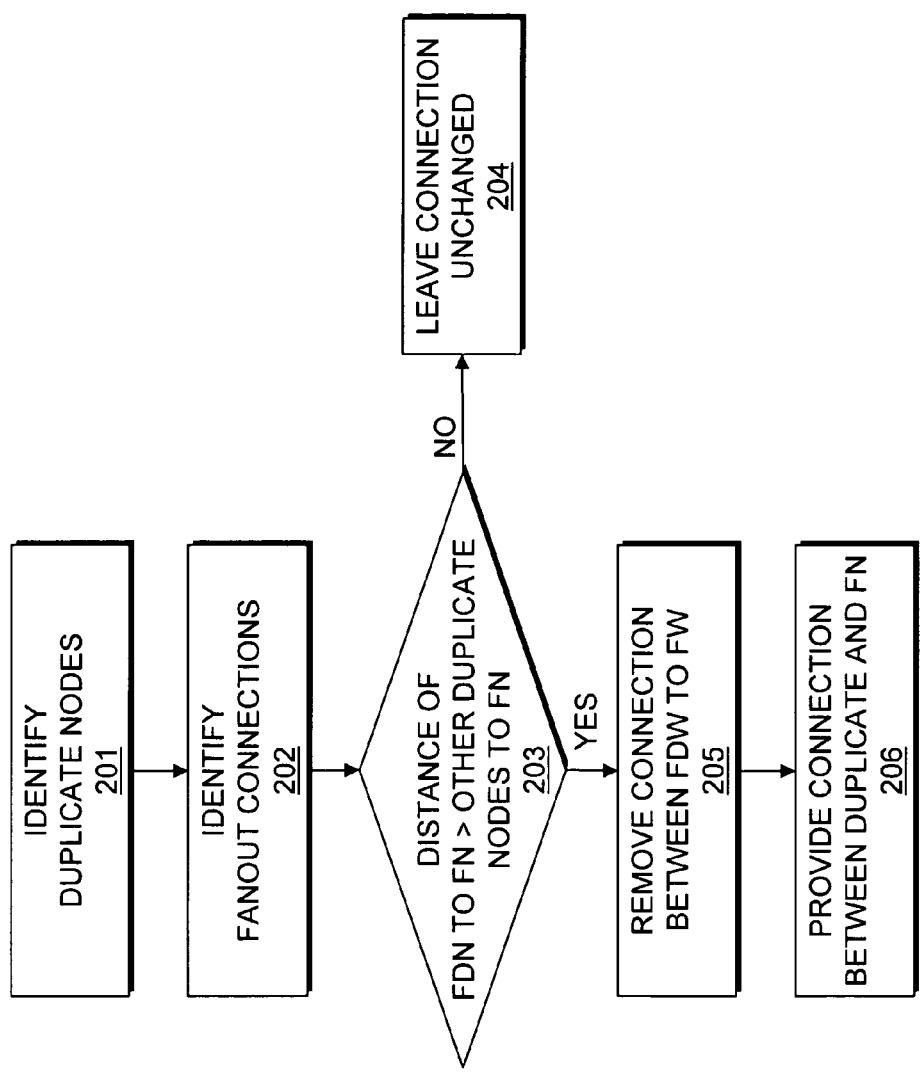
FIG. 2 is a flow chart illustrating a method for performing fanout splitting according to an embodiment of the present invention.

FIG. 2 is a flow chart illustrating a method for performing fanout splitting according to an embodiment of the present invention. Duplicate logic, represented as duplicate nodes, may be present in a system where the duplicate logic may have been created by the user or by synthesis operations that precede placement. Fanout splitting identifies duplicate nodes and rewires the circuit so that a fanout node that is driven by one of the duplicate nodes is driven by the duplicate node closest to it. The procedures shown in FIG. 2 may be implemented at 103 shown in FIG. 1. At 201, duplicate nodes are identified. According to an embodiment of the present invention, duplicate nodes may be identified by finding logic with structural similarities and/or functional similarities in the netlist.

At 202, fanout connections corresponding to the duplicate nodes are identified.

At 203, it is determined whether a distance between a first duplicate node (FDN) to its fanout node (FN) is larger than a distance between one or more other duplicate nodes to the fanout node. If the distance between the first duplicate node to its fanout node is not larger than the distance between one or more other duplicate nodes to the fanout node, control proceeds to 204. If the distance between the first duplicate node to its fanout node is larger than the distance between one or more other duplicate nodes to the fanout node, control proceeds to 205.

At 204, the present connection between the first duplicate node to its fanout node is left unchanged.

At 205, the connection between the first duplicate node to its fanout node is removed.

At 206, a new connection is provided between the duplicate closer to the fanout node and fanout node.

Figure 3B:
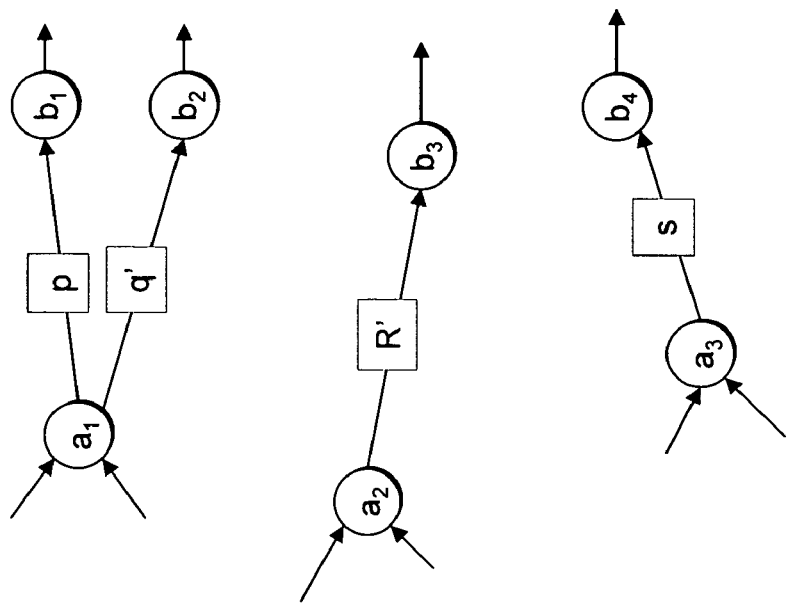
FIG. 3 illustrates an example of fanout splitting as a procedure for routability optimization according to an embodiment of the present invention.
Figure 3A:
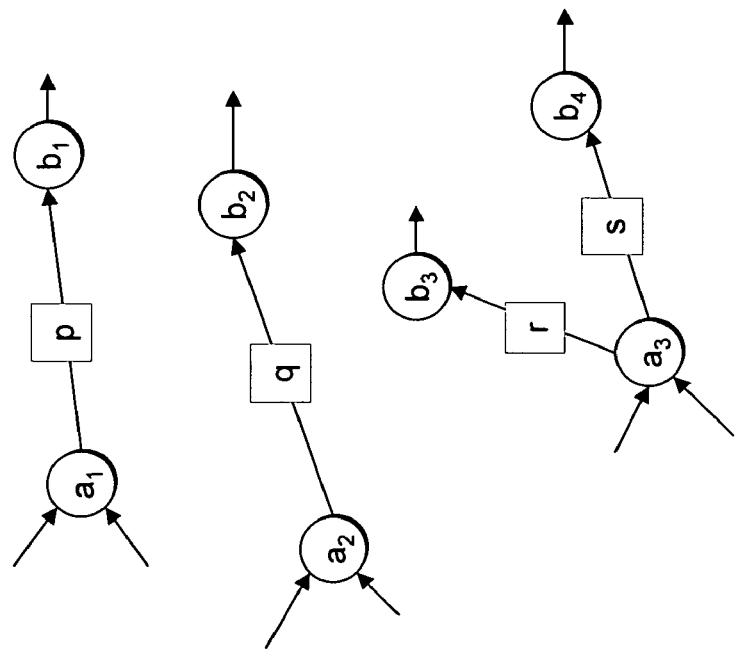

FIGS. 3a and 3b provide an example of fanout splitting as a procedure for routability optimization according to an embodiment of the present invention. In FIG. 3a, nodes a1, a2, and a3 are duplicate nodes representing duplicate logic. Duplicate logic may include, for example, LEs or LABs having structural similarities or functional similarities. Node b1 is a fanout node driven by node a1 over connection p. Node b2 is a fanout node driven by node a2 over connection q. Node b3 is a fanout driven by node a3 over connection r. Node b4 is a fanout node driven by node a3 over connection s. In this example, it is determined that fanout node b2 is closer to duplicate node a1 than duplicate node a2 as shown in FIG. 3a. As a result, connection q is removed, and new connection q' is inserted to connect fanout node b2 with duplicate node a1 as shown in FIG. 3b. Similarly, it is determined that node fanout b3 is closer to duplicate node a2 than duplicate node a3 as shown in FIG. 3a. As a result, connection r is removed and new connection r' is inserted to connect fanout node b3 with a2 as shown in FIG. 3b.

Figure 4:
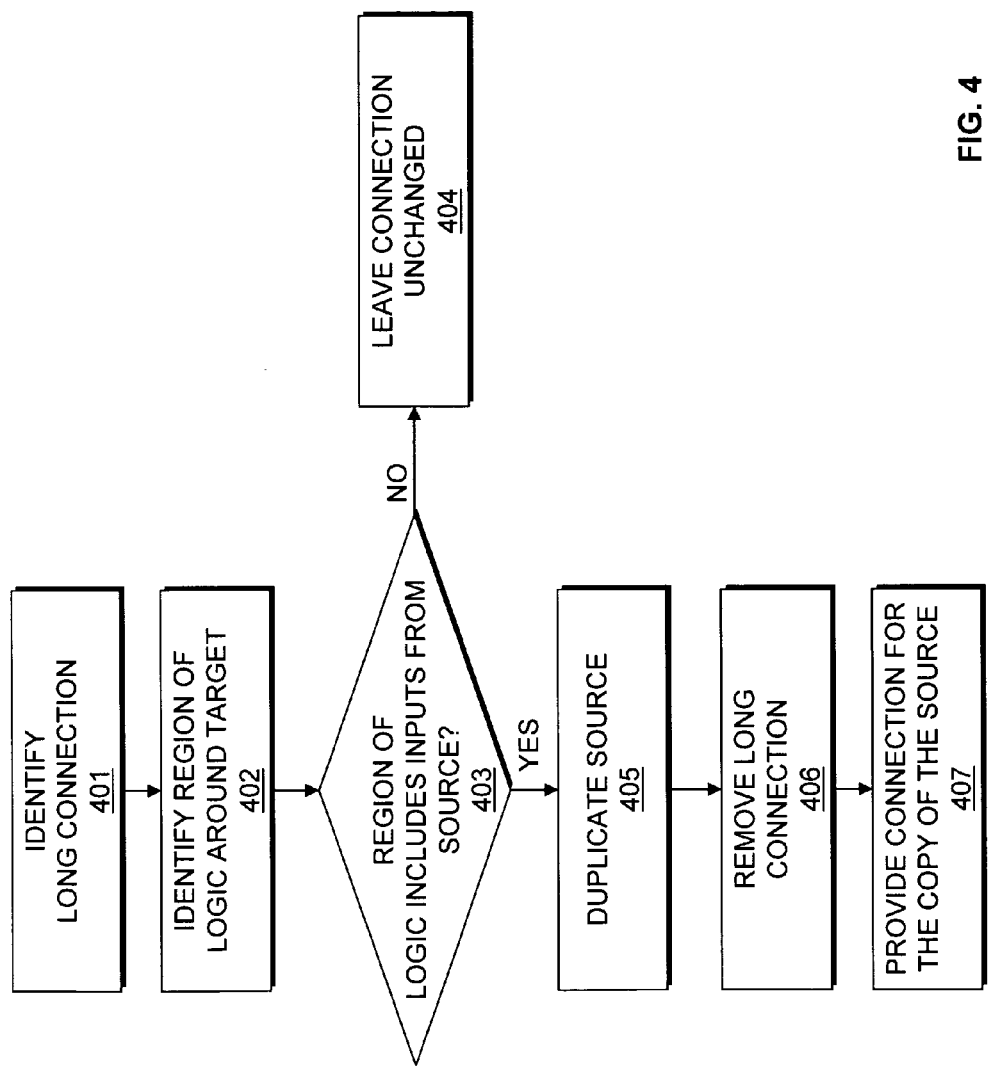
FIG. 4 is a flow chart illustrating a method for performing logic duplication according to an embodiment of the present invention.

FIG. 4 is a flow chart illustrating a method for performing logic duplication according to an embodiment of the present invention. Logic duplication may be appropriate for optimizing routability when a length of a connection from logic, represented as a source node, may be reduced by duplicating the logic (source node) and inserting the copy in a region that has access to inputs feeding the logic. The procedures shown in FIG. 4 may be implemented at 103 shown in FIG. 1. At 401, a long connection is identified. The long connection has an associated source node from which the long connection is a fanout from. The long connection also has an associated target node (fanout node) which the long connection is a fanin to. According to an embodiment of the present invention, a threshold value may be used to classify whether a connection is a long connection.

At 402, a region of logic around the target node of the long connection is identified. According to an embodiment of the present invention, the region of logic may be a circular, rectangular, or other shaped region that may selected or specified depending on an architecture of a target device.

At 403, it is determined whether the region of logic includes inputs feeding the source node of the long connection. If the region of logic does not include the inputs feeding the source node of the long connection, control proceeds to 404. If the region of logic includes the inputs feeding the source node of the long connection, control proceeds to 405.

At 404, the long connection is left unchanged.

At 405, the source node of the long connection is duplicated. The copy of the source node may be inserted in the region of logic.

At 406, the long connection is removed.

At 407, connections are provided from the inputs feeding the source node to the copy of the source node. A connection is also provided between the copy of the source node to the target node.

Figure 5B:
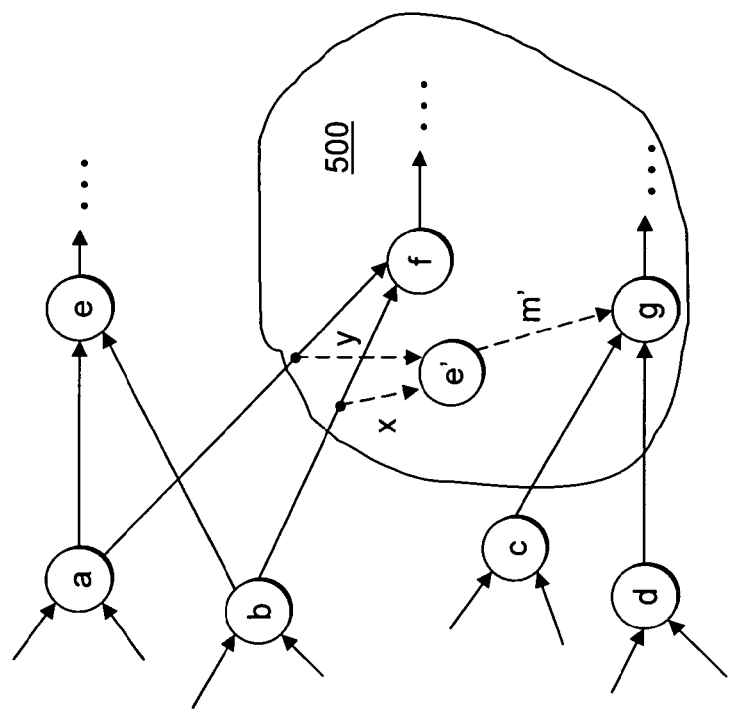
FIG. 5 illustrates an example of logic duplication as a procedure for routability optimization according to an embodiment of the present invention.
Figure 5A:
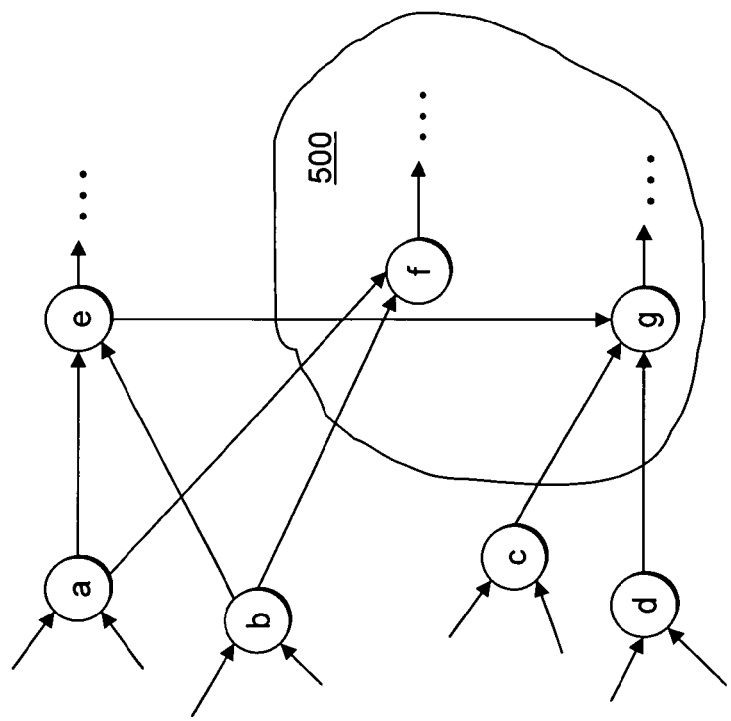

FIGS. 5a and 5b illustrate an example of logic duplication as a procedure for routability optimization according to an embodiment of the present invention. As shown in FIG. 5a, a long connection m has an associated source node e and a target node g. Nodes a and b feed the source node e. As shown in FIG. 5b, the long connection m can be removed if source node e is duplicated as e' and inserted into region 500 that includes target node g and inputs feeding source node e. Since nodes a and b already drive node f which is in the region containing target node g, the copy of the source node e' may be connected to nodes a and b using a short wire segment m'. Furthermore, node e' may be connected to the output of nodes a and b using short wire segments x and y.

Figure 6:
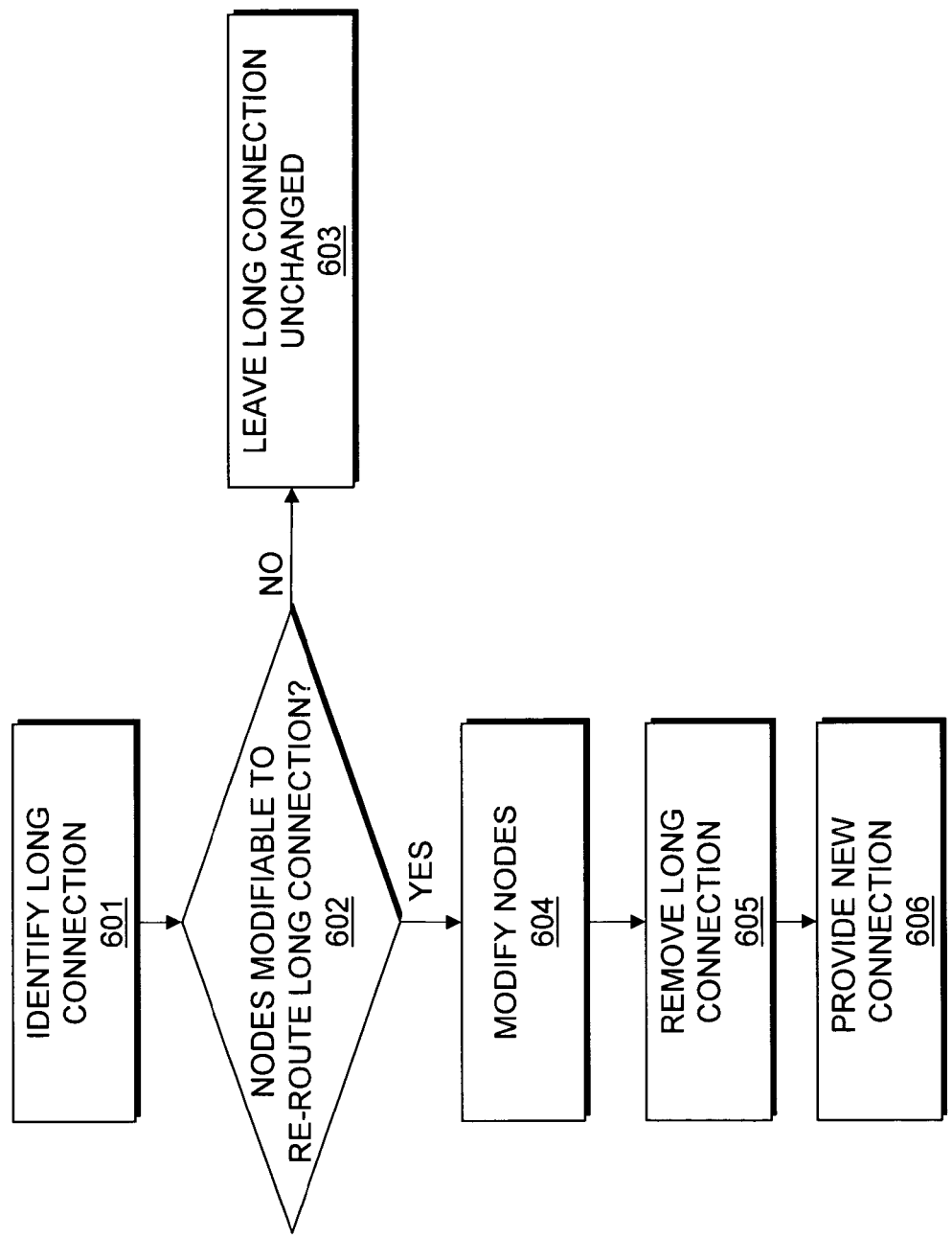
FIG. 6 is a flow chart illustrating a method for performing local re-wiring according to an embodiment of the present invention.

FIG. 6 is a flow chart illustrating a method for performing local wiring according to an embodiment of the present invention. According to an embodiment of the present invention, local rewiring considers a pair of logic, represented as nodes, and tries to determine if connections associated with the logic can be moved from one target node to new target node to shorten wirelength. Local rewiring is valid if the functionality of the logic involved in the local rewiring procedure (the target node and new target node) can be changed so that the overall functionality seen at the output of the logic is not changed. There may be situations where it is not possible to maintain a correct overall function after a wire has been moved. In these cases, the wire movement is rejected. The procedures shown in FIG. 6 may be implemented at 103 shown in FIG. 1. At 601, a long connection is identified. According to an embodiment of the present invention, a threshold value may be used to classify whether a connection is a long connection.

At 602, it is determined whether the long connection can be shortened by moving the long connection from its current node (target node) to another node (new target node). According to an embodiment of the present invention, a determination is made as to whether the nodes (logic represented by the nodes) may be modified such that the overall functionality seen at the output of the nodes is not changed and what the modifications are. If it is determined that the long connection can be shortened, control proceeds to 604. If it is determined that the long connection cannot be shortened, control proceeds to 603.

At 603, the long connection is left unchanged.

At 604, the target node and new target node are modified.

At 605, the long connection is removed from the source node to the target node.

At 606, a new connection is provided from the source node to the new target node.

Figure 7B:
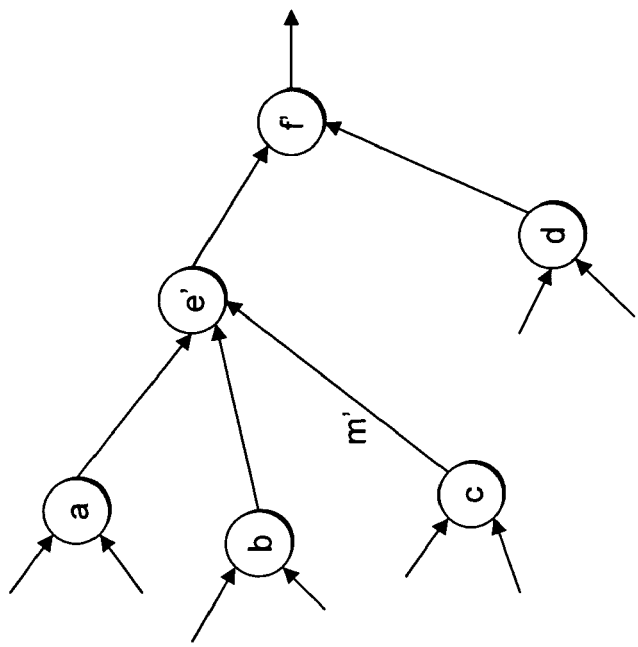
FIG. 7 illustrates an example of local rewiring as a procedure for routability optimization according to an embodiment of the present invention.
Figure 7A:
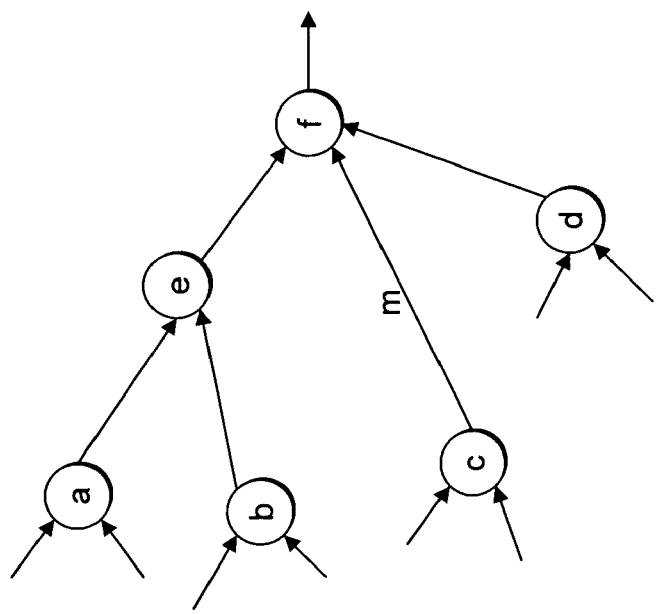

FIGS. 7a and 7b illustrate an example of local rewiring as a procedure for routability optimization according to an embodiment of the present invention. As shown in FIG. 7a, long connection m is identified. Long connection m includes a source node c and a target node f. Target node f and new target node e may be modified such that their outputs are not changed. Local rewiring changes the connection m from source node ec to target node f to connection m' from source node ec to new target node e' as shown in FIG. 7b. This reduces the wirelength required for the system. The logic in nodes e and f are modified to e' and f' in order to maintain their outputs.

FIGS. 1, 2, 4, and 6 are flow charts illustrating methods according to embodiments of the present invention. The techniques illustrated in these figures may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Figure 8:
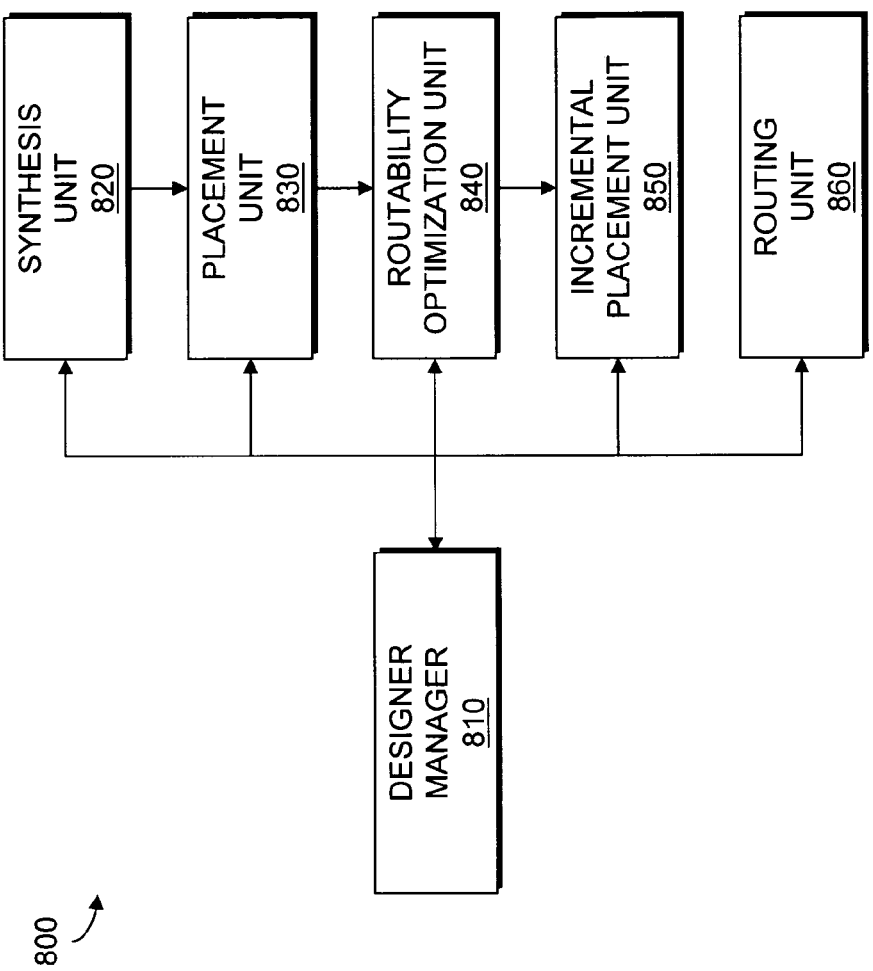
FIG. 8 is a block diagram of a system designer unit according to an embodiment of the present invention.

FIG. 8 illustrates a system designer 800 according to an embodiment of the present invention. The system designer 800 may be an EDA tool for designing a system on a target device. The target device may be, for example, an ASIC, a structured ASIC, an FPGA, a PLD, a PCB, or other circuitry. Furthermore the logic design may be implemented using semiconductor or nanoelectronic technology. FIG. 8 illustrates software modules implementing an embodiment of the present invention. According to one embodiment, system design may be performed by a computer system (not shown) executing sequences of instructions represented by the software modules shown in FIG. 8. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 800 includes a designer manager 810. The designer manager 810 is connected to and transmits data between the components of the system designer 800.

Block 820 represents a synthesis unit. The synthesis unit 820 generates a logic design of a system to be implemented in the target device. According to an embodiment of the system designer 800, the synthesis unit 820 takes a conceptual Hardware Description Language (HDL) design definition and generates an optimized logical representation of the system. The optimized logical representation of the system generated by the synthesis unit 820 may include a representation that has a minimized number of functional blocks and registers, such as logic gates and logic elements, required for the system. Alternatively, the optimized logical representation of the system generated by the synthesis unit 820 may include a representation that has a reduced depth of logic and that generates a lower signal propagation delay. The synthesis unit 820 also determines how to implement the functional blocks and registers in the optimized logic representation utilizing specific resources on a target device thus creating an optimized "technology-mapped" netlist. The technology-mapped netlist illustrates how the resources (components) on the target device are utilized to implement the system. In an embodiment where the target device is an ASIC, the components could be gates or standard cells. In an embodiment where the target device is a structured ASIC, the technology-mapped netlist may contain components that can be implemented in the structured ASIC fabric, such as RAM blocks, multiplier blocks, and gates from a library of gates.

Block 830 represents a placement unit. The placement unit 830 places the system on to the target device by determining which components or areas on the target device are to be used for specific functional blocks and registers. According to an embodiment of the system designer 800, the placement unit 830 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 830 may utilize a cost function in order to determine a good assignment of resources on the target device.

Block 840 represents a routability optimization unit. The routability optimization unit 840 performs routability optimizations that reduce the amount of wiring used to connect components in the placed logic design. The routability optimization unit 840 includes a fanout splitting unit 841. According to an embodiment of the routability optimization unit 840, the fanout splitting unit 841 identifies duplicate nodes and whether a distance between a first duplicate node to a fanout node of the first duplicate node is larger than a distance from a second duplicate node to the fanout node. The fanout splitting unit 841 removes a connection between the first duplicate node and the fanout node if the distance is larger, and inserts a connection between the second duplicate node and the fanout node. The routability optimization unit 840 includes a logic duplication unit 842. According to an embodiment of the routability optimization unit 840, the logic duplication unit 842 identifies a long connection and a region of logic around a target of the long connection. The logic duplication unit 842 duplicates a source of the long connection if the region of logic includes inputs to the source of the long connection. The routability optimization unit includes a logical rewiring unit 843. According to an embodiment of the routability optimization unit 840, the logical rewiring unit 843 identifies a long connection. The logical rewiring unit 843 modifies logic in a target of the long connection and logic in a new target of the long connection. The logical rewiring unit 843 removes the long connection, and inserts a connection between a source of the long connection and the new target of the long connection.

Block 850 represents an incremental placement (IP) unit. The incremental placement unit 850 resolves architectural violations or illegalities generated from routability optimizations made by the routability optimization unit 840. The incremental placement unit 850 may evaluate resources on a target device such as LABs that have architectural violations or illegalities from routability optimization. The incremental placement unit 850 may perturb the preferred locations as little as possible to ensure that the final placement respects all architectural constraints. The incremental placement unit 850 may attempt to identify non-critical LEs that may be moved from their preferred locations to resolve architectural violations in order that truly critical elements may stay at their preferred locations.

Block 860 represents a routing unit. The routing unit 860 determines the routing resources on the target device to use to provide interconnection between the components implementing functional blocks and registers of the logic design.

Figure 9:
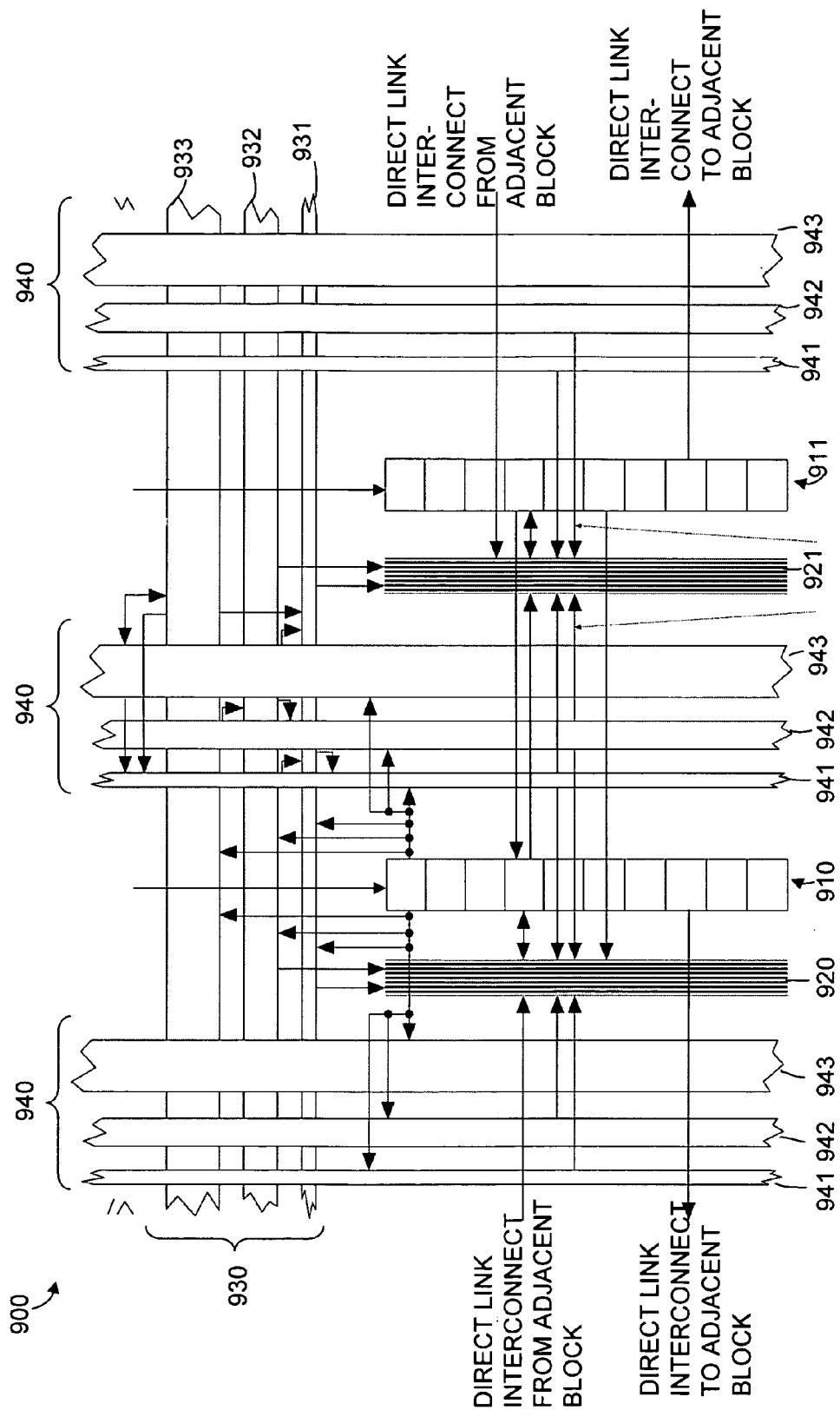
FIG. 9 illustrates an exemplary target device according to an embodiment of the present invention.

FIG. 9 illustrates an exemplary target device 900 according to an embodiment of the present invention. The present invention may be used to design a system onto the target device 900 which is an FPGA. According to one embodiment, the target device 900 is a chip having a hierarchical structure that may take advantage of wiring locality properties of circuits formed therein. The lowest level of the hierarchy is a logic element (LE) (not shown). An LE is a small unit of logic providing efficient implementation of user logic functions. According to one embodiment of the target device 900, an LE may include a 4-input lookup table (LUT) with a configurable flip-flop.

The target device 900 includes a plurality of logic-array blocks (LABs). Each LAB is formed from 10 LEs, LE carry chains, LAB control signals, LUT chain, and register chain connection lines. LUT chain connections transfer the output of one LE's LUT to the adjacent LE for fast sequential LUT connections within the same LAB. Register chain connection lines transfer the output of one LE's register to the adjacent LE's register within a LAB. LABs are grouped into rows and columns across the target device 900. A first column of LABs is shown as 910 and a second column of LABs is shown as 911.

The target device 900 includes memory blocks (not shown). The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within target device 900.

The target device 900 includes digital signal processing (DSP) blocks (not shown). The DSP blocks may be used to implement multipliers of various configurations with add or subtract features. The DSP blocks include shift registers, multipliers, adders, and accumulators. The DSP blocks may be grouped into columns across the target device 900.

The target device 900 includes a plurality of input/output elements (IOEs) (not shown). Each IOE feeds an I/O pin (not shown) on the target device 900. The IOEs are located at the end of LAB rows and columns around the periphery of the target device 900. Each IOE includes a bidirectional I/O buffer and a plurality of registers for registering input, output, and output-enable signals. When used with dedicated clocks, the registers provide performance and interface support with external memory devices, for example.

The target device 900 includes LAB local interconnect lines 920-921 that transfer signals between LEs in the same LAB. The LAB local interconnect lines are driven by column and row interconnects and LE outputs within the same LAB. Neighboring LABs, memory blocks, IOEs, or DSP blocks may also drive the LAB local interconnect lines 920-921 through direct link connections.

The target device 900 also includes a plurality of row interconnect lines ("H-type wires") 930 that span fixed distances. Dedicated row interconnect lines 930, that include H4 931, H8 932, and H24 933 interconnects, route signals to and from LABs, DSP blocks, IOEs, and memory blocks within the same row. The H4 931, H8 932, and H24 933 interconnects span a distance of up to four, eight, and twenty-four LABs respectively, and are used for fast row connections in a four-LAB, eight-LAB, and twenty-four-LAB region. The row interconnects 930 may drive and be driven by LABs, DSP blocks, RAM blocks, and horizontal IOEs.

The target device 900 also includes a plurality of column interconnect lines ("V-type wires") 940 that operate similarly to the row interconnect lines 930. The column interconnect lines 940 vertically routes signals to and from LABs, memory blocks, DSP blocks, and IOEs. Each column of LABs is served by a dedicated column interconnect, which vertically routes signals to and from LABs, memory blocks, DSP blocks, and IOEs. These column interconnect lines 940 include V4 941, V8 942, and V16 943 interconnects that traverse a distance of four, eight, and sixteen blocks respectively, in a vertical direction. It should be appreciated that buffer placement may be performed on any one of the interconnect lines described.

FIG. 9 illustrates an exemplary embodiment of a target device. It should be appreciated that a system may include a plurality of target devices, such as that illustrated in FIG. 9, cascaded together. It should also be appreciated that the target device may include programmable logic devices arranged in a manner different than that on the target device 900. An target device may also include components other than those described in reference to the target device 900. Thus, while the invention described herein may be utilized on the architecture described in FIG. 9, it should be appreciated that it may also be utilized on different architectures, such as those employed by Altera® Corporation in its APEX™, and Mercury™, Stratix™, Stratix™ II, Cyclone™, Cyclone™ II, family of chips and those employed by Xilinx®, Inc. in its Virtex™, Virtex™ II, Virtex™ II Pro, and Virtex™ III line of chips.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
    synthesizing the system;
    placing the system on the target device;
    optimizing placement of the system by identifying a long connection, modifying logic in a target of the long connection and logic in a new target of a replacement for the long connection, removing the long connection, and inserting a connection between a source of the long connection and the new target of the replacement for the long connection;
    and
    routing the system after optimizing placement.

2. The method of claim 1, wherein optimizing placement of the system for routing further comprises finding an optimal routing solution that utilizes less wire length.

3. The method of claim 1, wherein optimizing placement of the system for routing further comprises performing fanout splitting.

4. The method of claim 3, wherein performing fanout splitting comprises re-assigning a connection between duplicate nodes in order to conserve wire length.

5. The method of claim 3, wherein performing fanout splitting comprises:
    identifying duplicate nodes created during synthesis;
    determining whether a distance between a first duplicate node to a fanout node of the first duplicate node is larger than a distance from a second duplicate node to the fanout node;
    removing a connection between the first duplicate node and the fanout node if the distance is larger; and
    inserting a connection between the second duplicate node and the fanout node.

6. The method of claim 1, wherein optimizing placement of the system for routing further comprises performing logic duplication.

7. The method of claim 6, wherein performing logic duplication comprises:
    identifying a long connection;
    identifying a specified shaped region of logic around a target of the long connection;
    duplicating a source of the long connection if the region of logic includes inputs to the source of the long connection.

8. The method of claim 7, further comprising:
    removing the long connection;
    inserting a connection between a duplicated source of the long connection and the target of the long connection; and
    inserting connections between the inputs to the source of the long connection and the duplicated source of the long connection.

9. The method or claim 1, further comprising performing incremental placement on optimizations to placement of the system for routing that result in illegalities in placement to resolve the illegalities.

10. An article of manufacture comprising a machine accessible medium including sequences of instructions, the sequences of instructions including instructions which when executed cause the machine to perform:
    synthesizing a system;
    placing the system on a target device;
    optimizing placement of the system for routing by 1) identifying duplicate nodes created during synthesis, 2) determining whether a distance between a first duplicate node to a fanout node of the first duplicate node is larger than a distance from a second duplicate node to the fanout node, 3) removing a connection between the first duplicate node and the fanout node if the distance is larger, and 4) inserting a connection between the second duplicate node and the fanout node; and
    routing the system.

11. The article of manufacture of claim 10, wherein optimizing placement of the system for routing comprises finding an optimal routing solution that utilizes less wire length.

12. The article of manufacture of claim 10, further comprising instructions which when executed causes the machine to further perform incremental placement on optimizations to placement of the system for routing that result in illegalities in placement to resolve the illegalities.

13. A system designer, comprising:
    a synthesis unit to determine how to implement a system with components on a target device;
    a placement unit to determine which components on the target device to assign to the system;
    a routability optimization unit to optimize placement of components such that a length of wire required to connect the components is minimized, wherein the routability optimization unit comprises a logic duplication unit to duplicate a source of a long connection if a specified shaped region of logic associated with a target of the long connection includes inputs to the source of the long connection; and
    a routing unit to determine which routing resources on the target device to assign to connect the components.

14. The system designer of claim 13, wherein the routability optimization unit comprises a fanout splitting unit to determine whether a distance between a first duplicate node generated during synthesis to a fanout node of the first duplicate node is larger than a distance from a second duplicate node generated during synthesis to the fanout node, and replacing a connection between the first duplicate node and the fanout node with a connection between the second duplicate node and the fanout node in response to the determination.

15. The system designer of claim 13, wherein the routability optimization unit comprises a logical rewiring unit to modify logic in a target of a long connection and logic in a new target of a replacement of the long connection, and to replace the long connection with a connection between a source of the long connection and the new target of the replacement of the long connection.

16. The system designer of claim 13, further comprising an incremental placement unit to perform incremental placement on optimizations to placement of the system for routing that result in illegalities in placement to resolve the illegalities.

* * * * *

UNITED STATES PATENT AND TRADEMARK OFFICE
CERTIFICATE OF CORRECTION

PATENT NO. : 7,620,925 B1
APPLICATION NO. : 11/520124
DATED : November 17, 2009
INVENTOR(S) : Manohararajah et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 166 days.

Signed and Sealed this

Twenty-sixth Day of October, 2010

David J. Kappos
*Director of the United States Patent and Trademark Office*